United States Patent
Yano et al.

(10) Patent No.: US 8,190,812 B2
(45) Date of Patent: May 29, 2012

(54) MEMORY SYSTEM CAPABLE OF RESTORING BROKEN INFORMATION

(75) Inventors: Junji Yano, Kanagawa (JP); Hidenori Matsuzaki, Minato-ku (JP); Kosuke Hatsuda, Minato-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/529,235

(22) PCT Filed: Feb. 10, 2009

(86) PCT No.: PCT/JP2009/052588
§ 371 (c)(1),
(2), (4) Date: Dec. 22, 2009

(87) PCT Pub. No.: WO2009/107505
PCT Pub. Date: Sep. 3, 2009

(65) Prior Publication Data
US 2011/0185108 A1    Jul. 28, 2011

(30) Foreign Application Priority Data
Feb. 28, 2008 (JP) .................. 2008-048799

(51) Int. Cl.
*G06F 12/00* (2006.01)
(52) U.S. Cl. ............ 711/103; 711/104; 711/162; 714/2; 714/6.1; 365/185.01
(58) Field of Classification Search .................. 711/103, 711/104, 162; 714/2, 6, 6.1; 365/185.01
See application file for complete search history.

(56) References Cited

U.S. PATENT DOCUMENTS

| 5,696,967 | A | 12/1997 | Hayashi et al. |
| 7,114,117 | B2 * | 9/2006 | Tamura et al. ................ 714/763 |
| 7,613,880 | B2 * | 11/2009 | Miura et al. ................... 711/115 |
| 2004/0042269 | A1 * | 3/2004 | Tamura et al. ........... 365/185.12 |
| 2006/0041711 | A1 * | 2/2006 | Miura et al. ................... 711/103 |
| 2006/0224636 | A1 | 10/2006 | Kathuria et al. |

(Continued)

FOREIGN PATENT DOCUMENTS
JP        2004-62759        2/2004
(Continued)

OTHER PUBLICATIONS
U.S. Appl. No. 12/563,856, filed Sep. 21, 2009, Yano, et al.
(Continued)

*Primary Examiner* — Hong Kim
(74) *Attorney, Agent, or Firm* — Oblon, Spivak, McClelland, Maier & Neustadt, L.L.P.

(57) ABSTRACT

A memory system includes a volatile first storing unit, a nonvolatile second storing unit in which a plurality of memory cells that can store multi-value data are arranged, the memory cells having a plurality of pages, and a controller that performs data transfer between a host apparatus and the second storing unit via the first storing unit. The controller includes a save processing unit that backs up, when, before data is written in the second storing unit in a write-once manner, data is written in a lower order page of a memory cell same as that of a page in which the data is written, the data of the lower order page and a broken-information-restoration processing unit that restores, when the data in the lower order page is broken, the broken data using the backed-up data.

15 Claims, 14 Drawing Sheets

U.S. PATENT DOCUMENTS

| | | | |
|---|---|---|---|
| 2007/0211530 A1* | 9/2007 | Nakano | 365/185.08 |
| 2009/0100290 A1 | 4/2009 | Nakanishi et al. | |
| 2009/0228739 A1* | 9/2009 | Cohen et al. | 714/6 |
| 2010/0169551 A1* | 7/2010 | Yano et al. | 711/103 |
| 2010/0169553 A1* | 7/2010 | Yano et al. | 711/103 |
| 2011/0022784 A1* | 1/2011 | Yano et al. | 711/103 |
| 2011/0060864 A1* | 3/2011 | Yoshii et al. | 711/103 |

FOREIGN PATENT DOCUMENTS

| | | |
|---|---|---|
| JP | 2004-192789 A | 7/2004 |
| WO | 2007 023674 | 3/2007 |

OTHER PUBLICATIONS

U.S. Appl. No. 12/566,236, filed Sep. 24, 2009, Yano, et al.

* cited by examiner

AFTER LOWER ORDER PAGE WRITING AND BEFORE HIGHER ORDER PAGE WRITING

BEFORE HIGHER ORDER PAGE WRITING AND AFTER ADJACENT CELL WRITING

AFTER HIGHER ORDER PAGE WRITING

LOWER ORDER PAGE DATA 1     LOWER ORDER PAGE DATA 0
HIGHER ORDER PAGE DATA 0    HIGHER ORDER PAGE DATA 1

FIG.13A
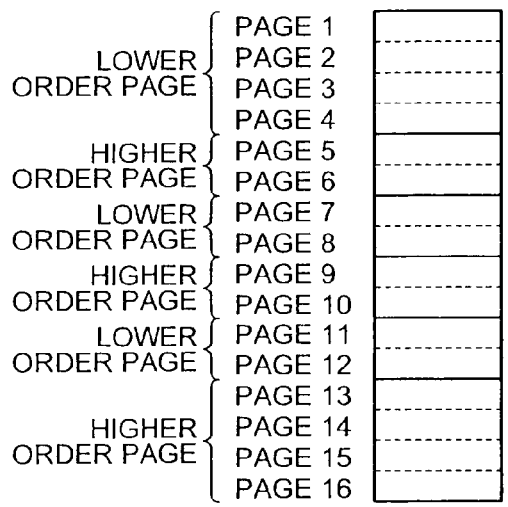
 PAGE TO BE WRITTEN
FIG.13B
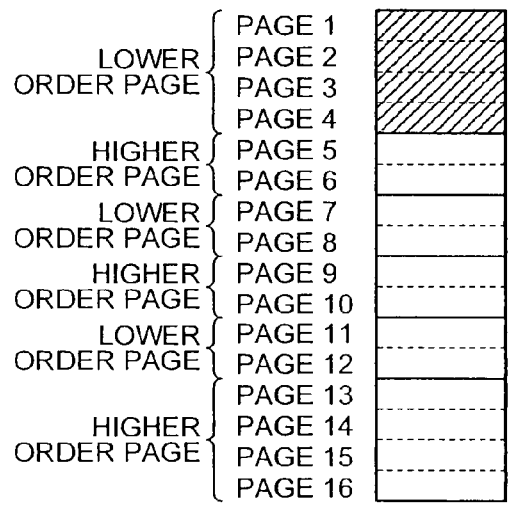
 PAGE TO BE WRITTEN
FIG.13C
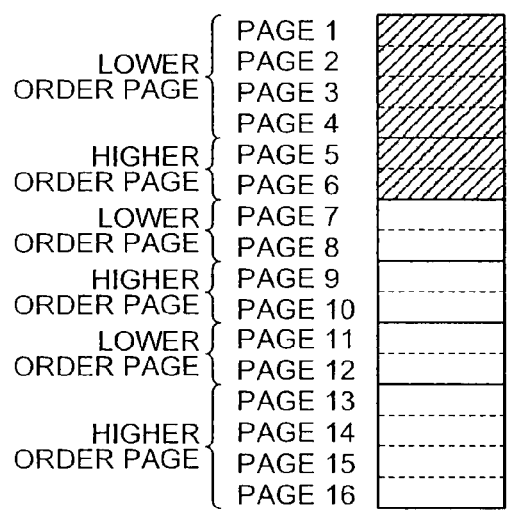
 PAGE TO BE WRITTEN

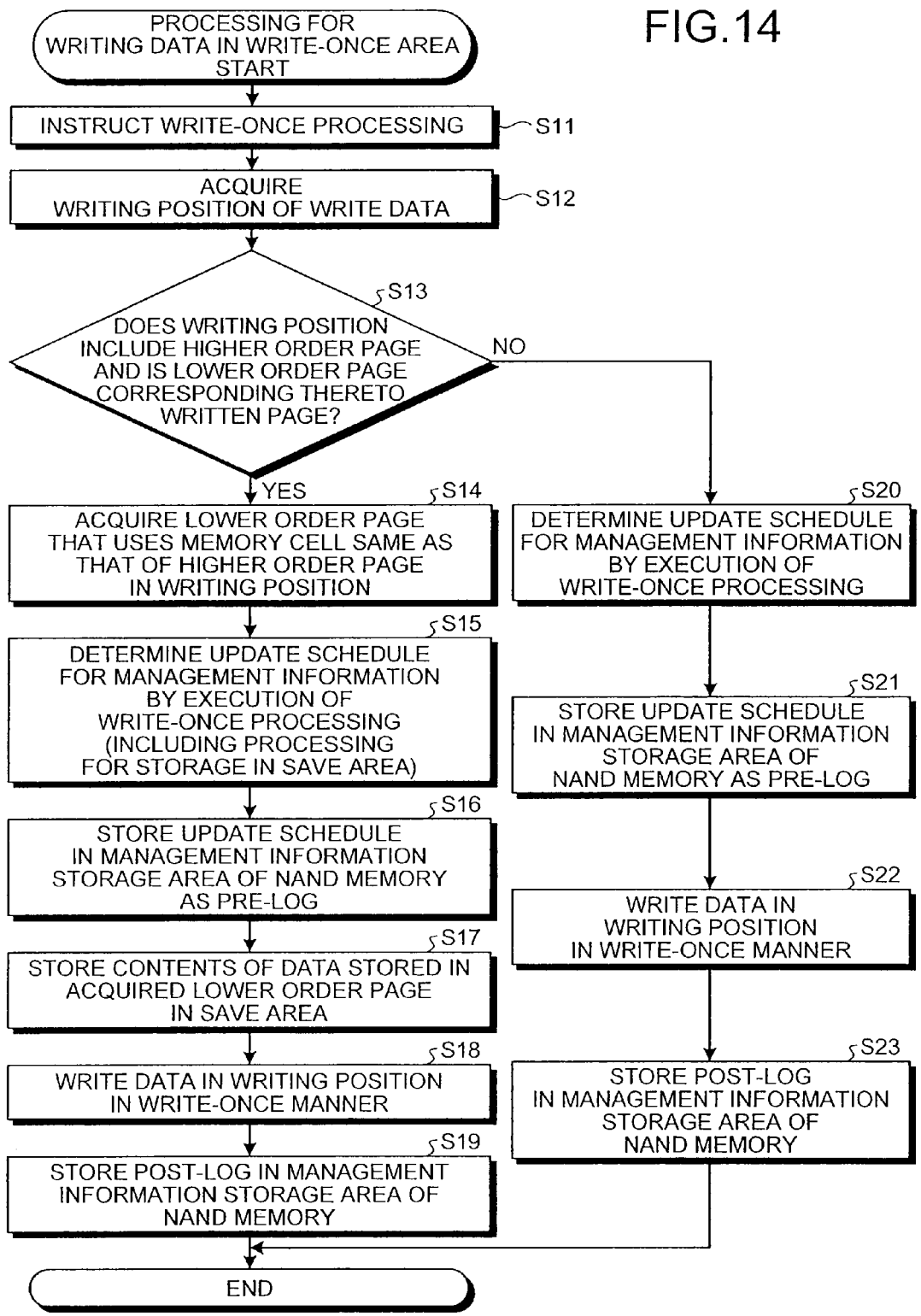

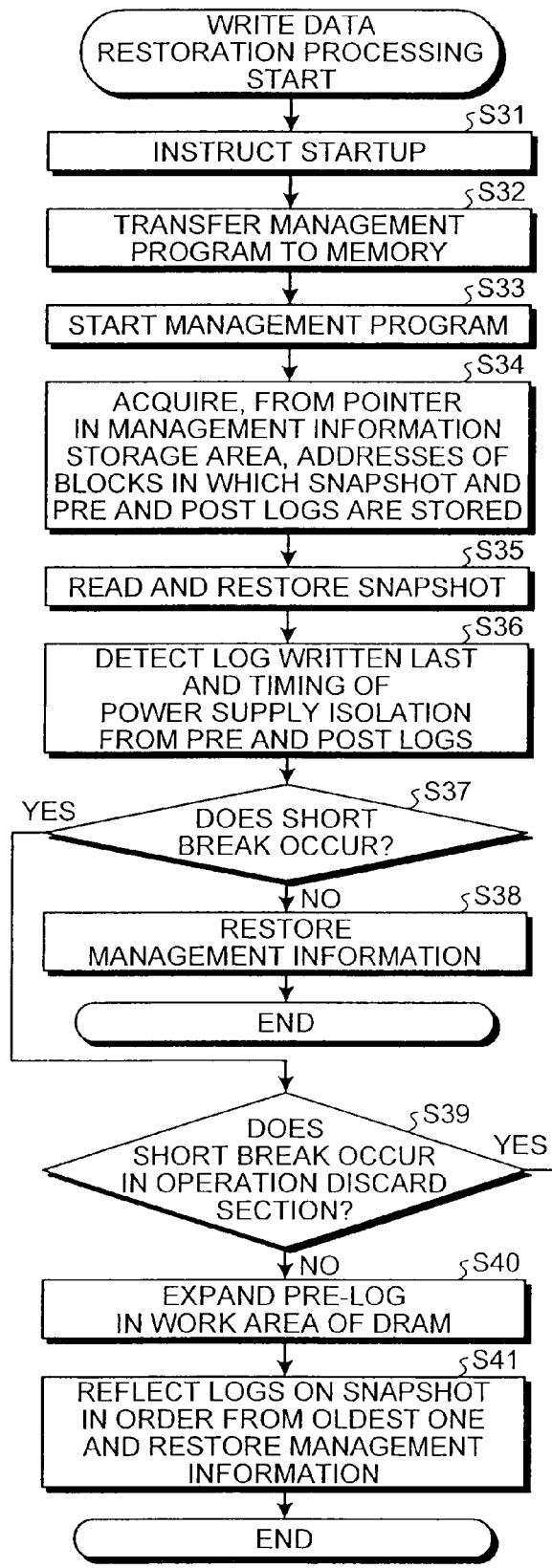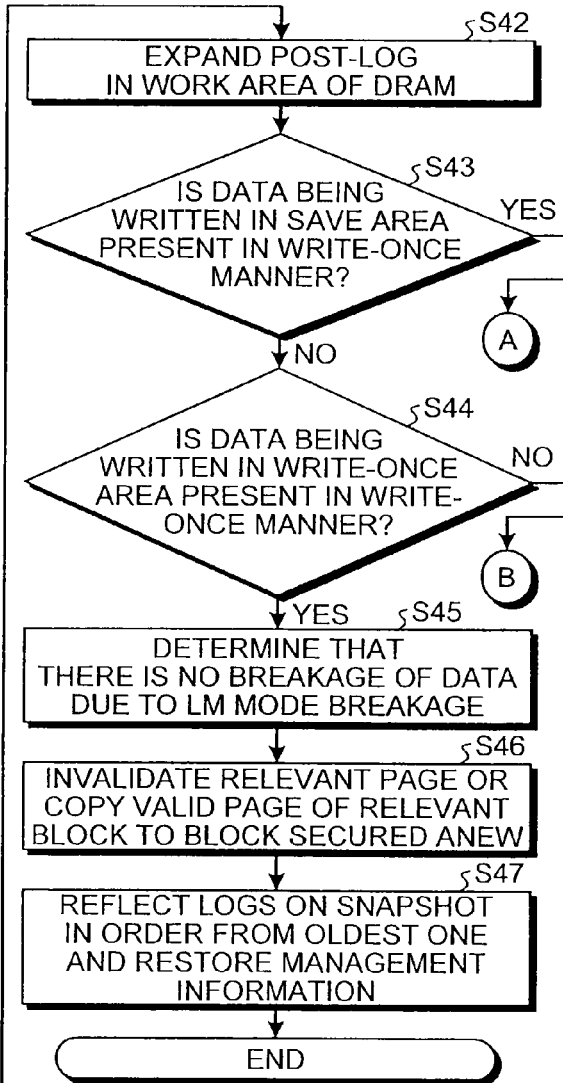
FIG.16

MEMORY SYSTEM CAPABLE OF RESTORING BROKEN INFORMATION

TECHNICAL FIELD

The present invention relates to a memory system employing a nonvolatile semiconductor storage device.

BACKGROUND ART

Some personal computers (PC) employ a hard disk device as a secondary storage device. In such PCs, a technology is known for backing up data that has been stored in the hard disk device to prevent the data from becoming invalid because of some failure. For example, when act of changing data in the hard disk device is detected, a snapshot as a backup copy of the data before the change is taken and a log of changes made to the data is generated. Then, processing for taking a new snapshot, invalidating a log taken in the past before the new snapshot was taken, and generating a new log is repeated at every predetermined time (see, for example, US Patent Application Publication No. 2006/0224636). In case data becomes invalid due to some reason, the data can be restored by referring to the snapshot and the log.

In recent years, a capacity of a NAND flash memory as a nonvolatile semiconductor storage device has been increased dramatically. As a result, PCs including a memory system having the NAND flash memory as a secondary storage device have been put to practical use.

However, the technology disclosed in US Patent Application Publication No. 2006/0224636 cannot be applied to backup of data stored in such a personal computer having the NAND flash memory as the secondary storage device as in the case of backup of data stored in the personal computer having the hard disk device as the secondary storage device. This is because a multi-value memory technology that can store a plurality of data (multi-value data) equal to or larger than 2 bits in one memory cell is employed to increase the capacity of the NAND flash memory.

A memory cell configuring a multi-value memory has a field effect transistor structure having a stacked gate structure in which a gate insulating film, a floating gate electrode, an inter-gate insulating film, and a control gate electrode are stacked in order on a channel region and a plurality of threshold voltages can be set according to the number of electrons accumulated in the floating gate electrode. In order to make it possible to perform multi-value storage based on the plurality of threshold voltages, the distribution of a threshold voltage corresponding to one data needs to be made extremely narrow.

For example, as a multi-value memory that can store four values, there is a multi-value memory that includes a lower order page and a higher order page in one memory cell and stores 2 bits (four values) by writing 1-bit data in the respective pages. In a method of writing data in such a multi-value memory, after data is written in a lower order page of a first memory cell, data is written in a lower order page of a memory cell (a second memory cell) that is adjacent to the first memory cell. After data is written in this adjacent memory cell, data is written in a higher order page of the first memory cell (see, for example, JP-A 2004-192789 (KO-KAI)).

However, in such a multi-value memory, a threshold voltage of the first memory cell in which data has been written earlier fluctuates because of a threshold voltage of the second memory cell in which the data is written later and that is adjacent to the first memory cell. Therefore, in the multi-value memory, it is likely that lower order page breakage occurs in which, if writing is suspended because of, for example, abnormal isolation of a power supply (hereinafter referred to as a short break) while data is being written in a higher order page of a certain memory cell, data in a lower order page in which the data is written earlier is also broken.

Therefore, in the personal computer having the NAND flash memory as the secondary storage device, for example, when the lower order page data breakage occurs because of a short break while the log is written in a higher order page of a certain memory cell as disclosed in US Patent Application Publication No. 2006/0224636, there is a problem in that, not only the data that is currently being written is broken, even data in a lower order page of the memory cell in which data is being currently written is broken and the data cannot be restored. In other words, there is a problem in that the method of taking backup using the technique disclosed in US Patent Publication No. 2006/0224636 for the personal computer including the memory system having the NAND flash memory as the secondary storage device is insufficient for restoring a state of the personal computer to a state before a short break.

In particular, when the memory system is started next time after a short break occurs during writing in a higher order page of a certain memory transistor, in the conventional method, a state of the memory system cannot be reset to a latest state before the short break occurs. Processing for restoring the memory system to the latest state when a short break occurs is not proposed.

DISCLOSURE OF INVENTION

A memory system according to an embodiment of the present invention comprises: a volatile first storing unit; a nonvolatile second storing unit in which a plurality of memory cells that can store multi-value data are arranged, the memory cells having a plurality of pages; and a controller that performs data transfer between a host apparatus and the second storing unit via the first storing unit, stores management information including a storage position of the data stored in the second storing unit during a startup operation of the memory system into the first storing unit, and performs, while updating stored management information, data management in the first and second storing units based on the stored management information. The controller includes a save processing unit that backs up, before writing data in the second storing unit in a write-once manner, if data has been already written in a lower order page of a memory cell same as that of a page in which the data is written, the data of the lower order page; and a broken-information-restoration processing unit that restores, when the data in the lower order page is broken, the broken data using the data backed-up by the save processing unit.

BRIEF DESCRIPTION OF DRAWINGS

FIGS. 13A to 13E are diagrams for explaining lower order page data breakage during write-once processing;

FIG. 14 is a flowchart of an example of a procedure of processing for writing data in a write-once area of the memory system;

FIGS. 16 and 17 are flowcharts of an example of restoration processing for write data after occurrence of a short break.

BEST MODE(S) FOR CARRYING OUT THE INVENTION

Exemplary embodiments of a memory system according to the present invention are explained in detail below with reference to the accompanying drawings. The present invention is not limited by this embodiment.

Figure 1:
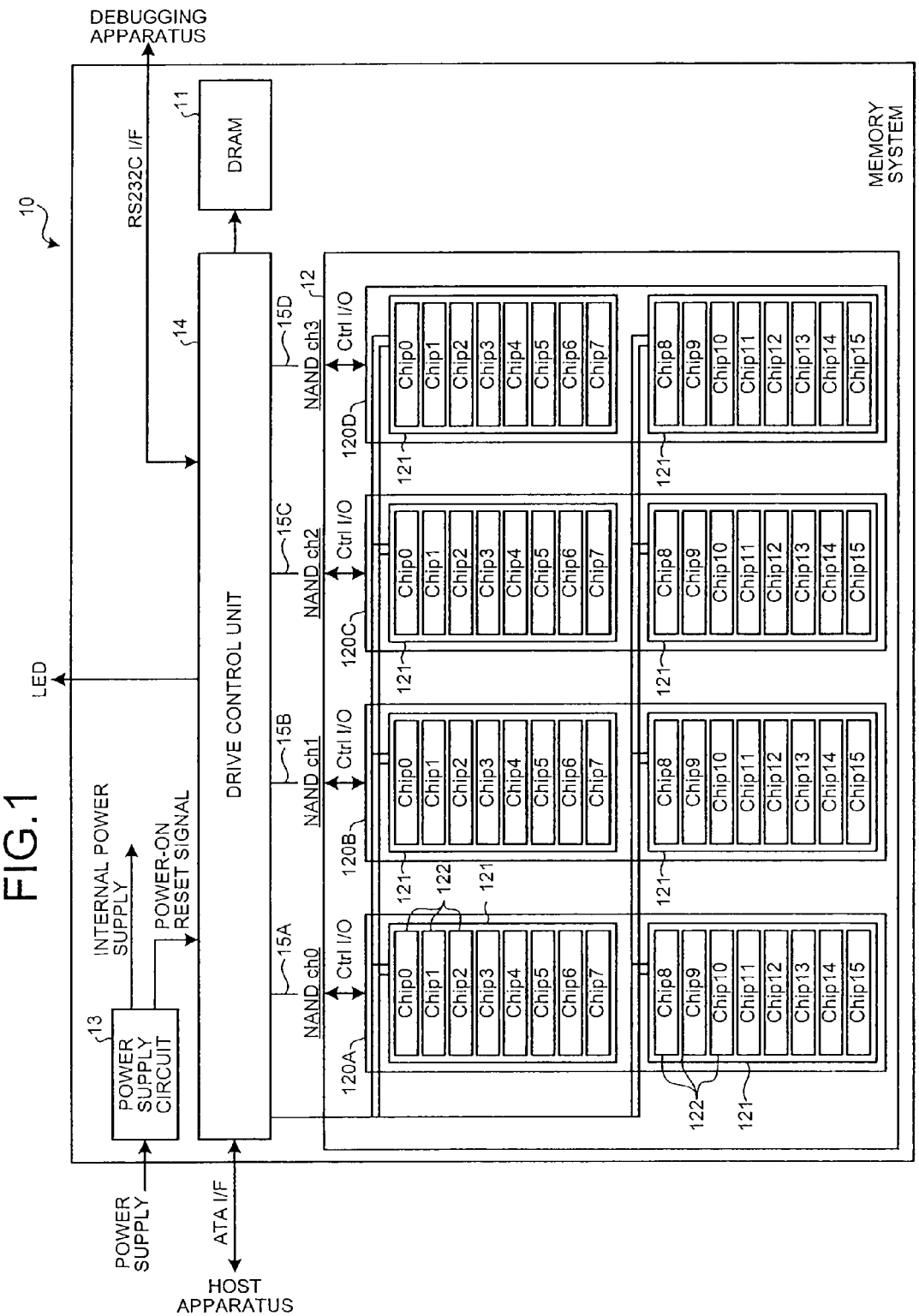
FIG. 1 is a block diagram of an example of a configuration of a memory system according to a first embodiment of the present invention.

A memory system according to an embodiment of the present invention includes a nonvolatile semiconductor storage device and is used as a secondary storage device (SSD: Solid State Drive) of a host apparatus such as a personal computer. The memory system has a function of storing data requested by a host apparatus to be written and reading out data requested by the host apparatus to be read out and outputting the data to the host apparatus. FIG. 1 is a block diagram of an example of a configuration of a memory system 10 according to the present embodiment. This memory system 10 includes a DRAM (Dynamic Random Access Memory) 11 as a first storing unit, a NAND flash memory (hereinafter, "NAND memory") 12 as a second storing unit, a power supply circuit 13, and a drive control unit 14 as a controller.

The DRAM 11 is used as a storing unit for data transfer, management information recording, or a work area. Specifically, when the DRAM 11 is used as a storing unit for data transfer, the DRAM 11 is used for temporarily storing data requested by the host apparatus to be written before the data is written in the NAND memory 12, and the DRAM 11 is used to read out data requested by the host apparatus to be read out from the NAND memory 12 and temporarily storing the read data. When the DRAM 11 is used as a storing unit for management information recording, the DRAM 11 is used for storing management information for managing storage positions of data stored in the DRAM 11 and the NAND memory 12. When the DRAM 11 is used as a storing unit for a work area, the DRAM 11 is used, for example, during expansion of logs used when management information is restored.

The NAND memory 12 is used as a storing unit for storing therein data. Specifically, the NAND memory 12 stores therein data designated by the host apparatus, stores therein, for backup, management information managed by the DRAM 11, and store therein the management program (firmware) of memory system 10. In FIG. 1, the NAND memory 12 that includes four channel correspondence storage areas 120A to 120D has been shown as an example. Each of the channel correspondence storage areas 120A to 120D includes two packages 121 each including eight chips 122 having a storage capacity of a predetermined size (e.g., 2 GB). The channel correspondence storage areas 120A to 120D are connected via the drive control unit 14 and buses 15A to 15D. Each bus among the buses 15A to 15D connected to each of the channel correspondence storage areas 120A to 120D forms a channel.

The power supply circuit 13 receives external power supply and generates a plurality of internal power supplies to be supplied to respective units of the memory system 10 from the external power supply. The power supply circuit 13 detects a state of the external power supply, i.e., a rising edge or a falling edge, generates a power-on reset signal based on the detected state, and outputs the power-on reset signal to the drive control unit 14.

The drive control unit 14 controls the DRAM 11 and the NAND memory 12. As explained in detail later, for example, the drive control unit 14 performs restoration processing for management information and storage processing for management information according to the power-on reset signal from the power supply circuit 13. The drive control unit 14 transmits and receives data to and from a host apparatus via an ATA interface (I/F) and transmits and receives data to and from a debugging apparatus via an RS232C I/F. Furthermore, the drive control unit 14 outputs a control signal for controlling on/off of an LED for state display provided on the outside of the memory system 10.

Figure 2:
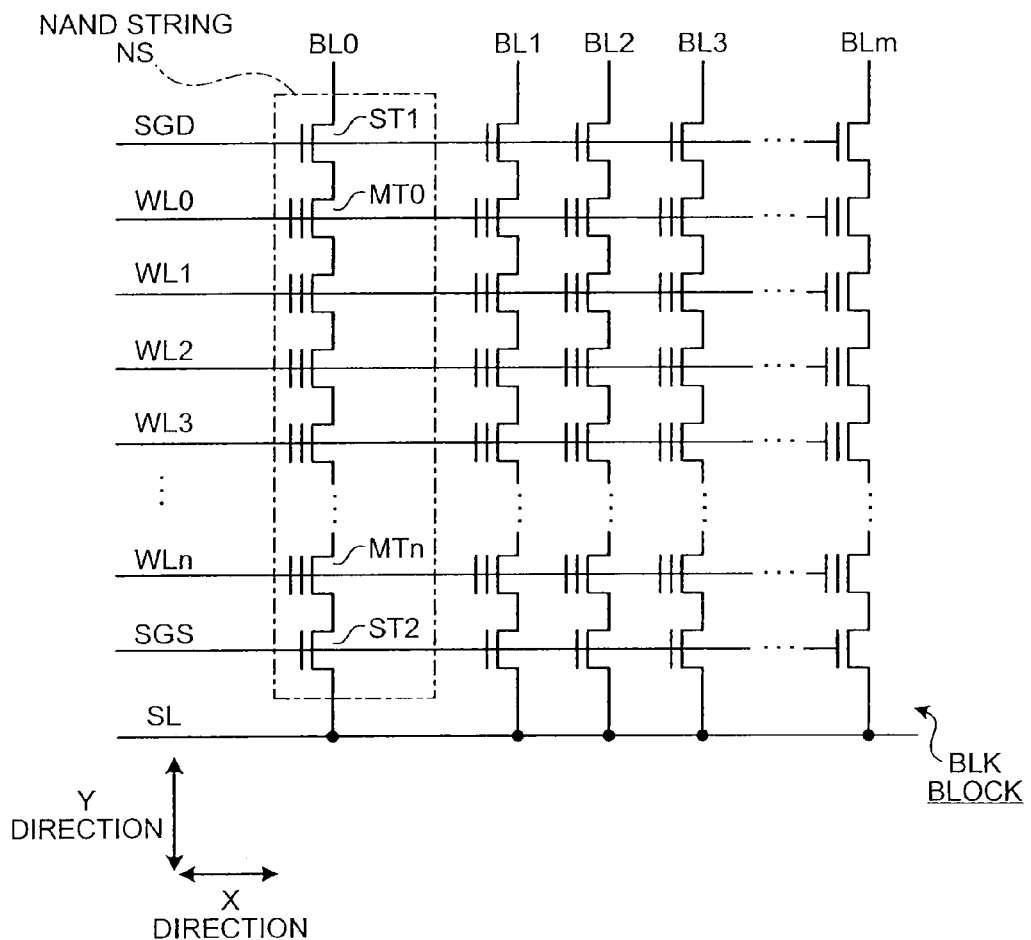
FIG. 2 is a circuit diagram of an example of a configuration of an arbitrary block of a NAND memory.

A configuration of the NAND memory 12 is explained in detail below. The NAND memory 12 is configured by arraying a plurality of blocks, which are units of data erasing, on a substrate. FIG. 2 is a circuit diagram of an example of a configuration of an arbitrary block of the NAND memory 12. In FIG. 2, left-right direction is set as an X direction and a direction perpendicular to the X direction is set as a Y direction.

Each block BLK of the NAND memory 12 includes (m+1) (m is an integer equal to or larger than 0) NAND strings NS arrayed in order along the X direction. Each NAND string NS has (n+1) (n is an integer equal to or larger than 0) memory cell transistors MT0 to MTn that share a diffusion region (a source region or a drain region) between memory cell transistors MT adjacent to each other in the Y direction. Moreover, the memory cell transistors MT0 to MTn are connected in series in the Y direction. In addition, selection transistors ST1 and ST2 arranged at both ends of a row of the (n+1) memory transistors MT0 to MTn.

Each memory cell transistors MT0 to MTn is a field effect transistor having a stacked gate structure formed on a semiconductor substrate. The stacked gate structure includes a charge accumulation layer (a floating gate electrode) formed on the semiconductor substrate via a gate insulating film and a control gate electrode formed on the charge accumulating layer via an inter-gate insulating film. Moreover, the memory cell transistors MT0 to MTn are multi-value memories in which a threshold voltage changes according to the number of electrons accumulated in the floating gate electrode and two or more bit data can be stored depending on the difference in the threshold voltage. It is assumed in following explanation that memory cell transistors MT0 to MTn are multi-value memories that can store quaternary values. However, the memory cell transistors MT0 to MTn can be multi-value memories that can store values larger than the quaternary values.

Word lines WL0 to WLn are respectively connected to the control gate electrodes of the memory cell transistors MT0 to MTn of each NAND string NS. Memory cell transistors MTi (i=0 to n) in each of the NAND strings NS are connected in common by the same word lines (i=0 to n). In other words, the control gate electrodes of the memory cell transistors MTi present on the same row in the block BLK are connected to the same word line WLi. Specifically, a group of the (m+1) memory cell transistors MTi connected to the same word line WLi is a unit that forms one page. In the case of the multi-value memory that can store quaternary values, a group of the memory cell transistors MTi connected to the same word line WLi forms two pages. When a page in which data is written first is set as a lower order page and a page in which data is written next is set as a higher order page, in the NAND memory 12, writing and readout of data is performed in units of the pages.

Bit lines BL0 to BLm are respectively connected to drains of the (m+1) selection transistors ST1 in one block BLK. A selection gate line SGD is connected in common to gates of the selection transistors ST1 of each NAND string NS. Sources of the selection transistors ST1 are connected to drains of the memory cell transistors MT0. Similarly, a source line SL is connected in common to sources of the (m+1) selection transistors ST2 in one block BLK. A selection gate line SGS is connected in common to gates of the selection transistors ST2 of each NAND string NS. Drains of the selection transistors ST2 are connected to sources of the memory cell transistors MTn.

Although not shown in the figure, bit lines BLj (j=0 to m) in one block BLK connect drains of the selection transistors ST1 in common between bit lines BLj of other blocks BLK. In other words, the NAND strings NS in the same column in the blocks BLK are connected by the same bit line BLj.

In the NAND memory 12, as explained above, the minimum unit for writing and readout is one page in the memory cell transistor MTi group connected to the same word line WLi and the minimum unit for erasing is one block including a predetermined number of pages (hereinafter referred to as physical block). A plurality of the blocks form a plane and a plurality of the planes form one channel correspondence storage areas 120A to 120D. A plurality of the channel correspondence storage areas 120A to 120D forms one NAND memory 12. In an example explained below, it is assumed that the number of channels is four and the number of planes is two.

In this memory system, the channel correspondence storage areas 120A to 120D are connected in plurality to the drive control unit 14 in parallel to one another. Therefore, it is possible to actuate a plurality of channels in parallel, or actuate only one channel at a time.

Writing and readout processing may be performed or erasing may be performed with a predetermined number of physical blocks as a unit according to setting of the drive control unit 14. A set of the predetermined number of physical blocks in this case is referred to as logical block.

Figure 3A:
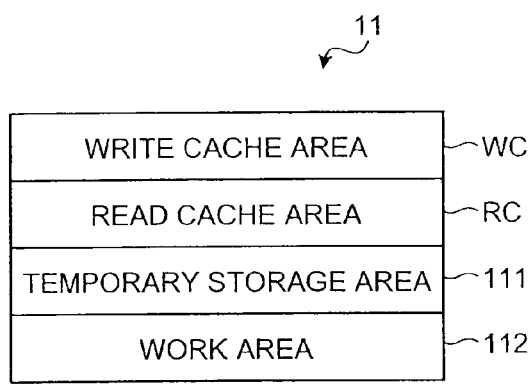
FIG. 3A is a schematic diagram of a functional configuration of a DRAM and FIG. 3B is a schematic diagram of a functional configuration of the NAND memory.
Figure 3B:
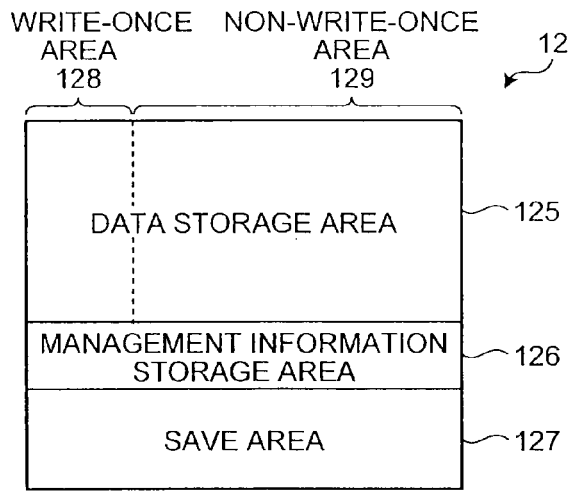

Functional configurations of the DRAM 11 and the NAND memory 12 are explained next. FIG. 3A is a schematic diagram of a functional configuration of the DRAM 11 and FIG. 3B is a schematic diagram of a functional configuration of the NAND memory 12. As shown in FIG. 3A, the DRAM 11 includes a write cache area in which data requested by the host apparatus to be written is stored, a read cache area RC in which data requested by the host apparatus to be read out is stored, a temporary storage area 111 in which management information for managing storage positions of data stored in the DRAM 11 and the NAND memory 12 is stored, and a work area 112 used when the management information is restored.

As shown in FIG. 3B, the NAND memory 12 includes a data storage area 125 in which data requested by the host apparatus to be written is stored, a management information storage area 126 in which management information managed by the temporary storage area 111 of the DRAM 11 is stored, and a save area 127 in which contents of a lower order page are backed up to preserve the contents written in the lower order page from lower order page data breakage in which the lower order page is broken by occurrence of abnormal power supply isolation (short break) or a program error (failure in writing in a NAND memory) while data is written in a higher order page of a memory cell transistor in which the lower order page is already written. The data storage area 125 of the NAND memory 12 is divided into a write-once area 128 in which data is written in a write-once manner and a non-write-once area 129 that is an area other than the write-once area 128 in the data storage area 125 and in which data is collectively written in a unit of one or a predetermined number of physical blocks. In this example, it is assumed that a data writing unit in the write-once area 128 is a page size unit and a data writing unit in the non-write-once area 129 is a physical block size unit or an integer times as large as the physical block size unit. Therefore, in the data storage area 125, areas for storing blocks are further divided into areas in page size units and managed. The program error occurs when the memory cell transistor is broken and data cannot be stored.

Figure 4:
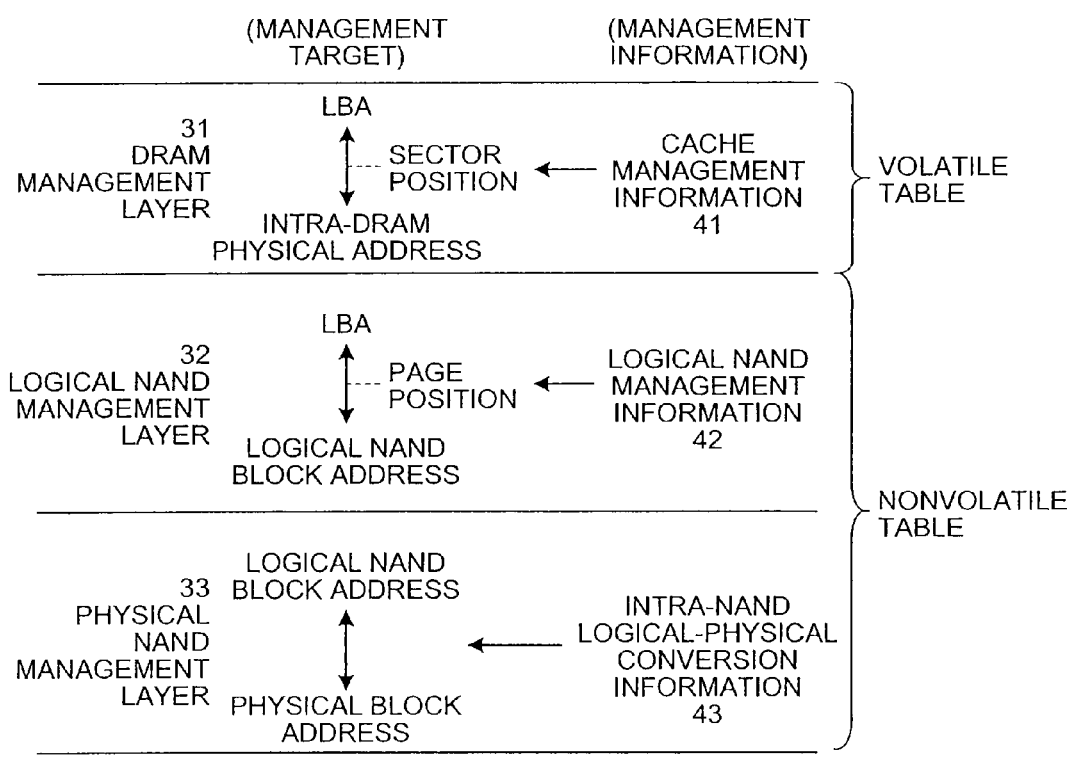
FIG. 4 is a diagram of an example of a layer structure for managing data stored in the memory system.

The management information managed in the temporary storage area 111 of the DRAM 11 is explained below. FIG. 4 is a diagram of an example of a layer structure for managing data stored in the memory system 10. It is assumed here that this data is the data requested by the host apparatus to be written or read out. In the memory system 10, data management is performed by a three-layer structure: a DRAM management layer 31, a logical NAND management layer 32, and a physical NAND management layer 33. The DRAM management layer 31 performs data management in the DRAM 11 that plays a role of a cache. The logical NAND management layer 32 performs logical data management in the NAND memory 12. The physical NAND management layer 33 performs physical data management in the NAND memory 12, life extension processing for the NAND memory 12, and the like.

In the write cache area WC and the read cache area RC of the DRAM 11, data designated by a logical address (hereinafter, "LBA (Logical Block Address)") managed by an address managing method of the host apparatus is stored in a physical address in a predetermined range on the DRAM 11 (hereinafter, "intra-DRAM physical address). Data in the DRAM management layer 31 is managed by cache management information 41 including a correspondence relation between an LBA of data to be stored and the intra-DRAM physical address and a sector flag indicating presence or absence of data in sector size units in a page.

Figure 5:
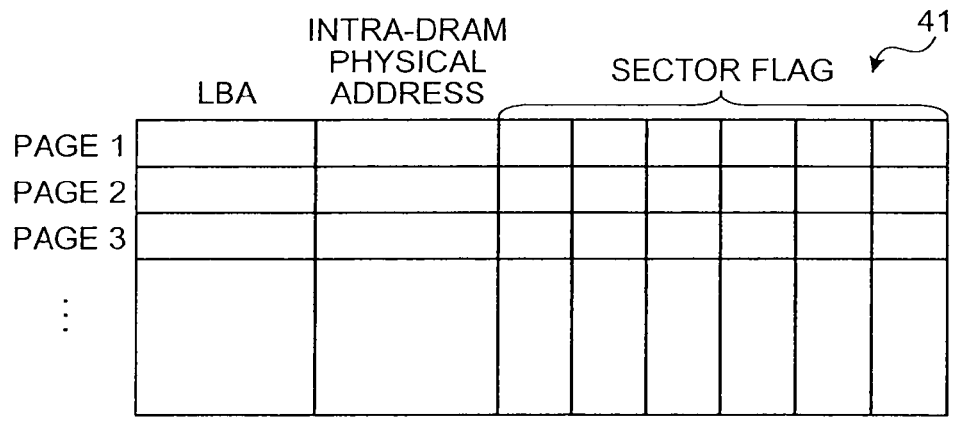
FIG. 5 illustrates an example of a cache management information table.

FIG. 5 illustrates an example of the cache management information 41 in tabular manner. The cache management information 41 is one entry for one area of a one page size of the DRAM 11. The number of entries is equal to or smaller than the number of pages that fit in the write cache area WC and the read cache area RC. In each of the entries, the LBA of data of a page size, the intra-DRAM physical address, and a sector flag indicating a position of valid data in each of areas obtained by dividing this page by a sector size are associated.

In the NAND memory 12, data from the DRAM 11 is stored in a physical address in a predetermined range (hereinafter, "intra-NAND physical address) on the NAND memory 12. In the NAND memory 12 formed by the multi-value memory, because the number of rewritable times is limited, the numbers of times of rewriting among the blocks configuring the NAND memory 12 are controlled by the drive control unit 14 to be equalized. In other words, when update of data written in a certain intra-NAND physical address in the NAND memory 12 is performed, the drive control unit 14 performs control to equalize the numbers of times of rewriting among the blocks configuring the NAND memory 12 to write, in a block different from the original block, data reflecting a portion required to be updated of a block in which the data to be updated is included and invalidate the original block.

As explained above, in the NAND memory 12, processing units are different in the writing and readout processing for data and the erasing processing for data. In the update processing for data, a position (a block) of data before update and a position (a block) of data after update are different. Therefore, in the first embodiment, an intra-NAND logical address used independently in the NAND memory 12 (hereinafter, "intra-NAND logical address") is provided besides the intra-NAND physical address.

Therefore, data in the logical NAND management layer 32 is managed by logical NAND management information 42 indicating a relation between an LBA of data in page size units received from the DRAM 11 and an intra-NAND logical address indicating a logical page position of the NAND memory 12 in which the received data is stored and a relation indicating an address range of a logical block having a size coinciding with that of a block (hereinafter, "physical block") as an erasing unit in the NAND memory 12. A collection of a plurality of the physical blocks can be set as a logical block. Data in the physical NAND management layer 33 is managed by intra-NAND logical address-physical address conversion information (hereinafter, "logical-physical conversion information") including a correspondence relation between the intra-NAND logical address as the logical block and the intra-NAND physical address as the physical block in the NAND memory 12.

Figure 6:
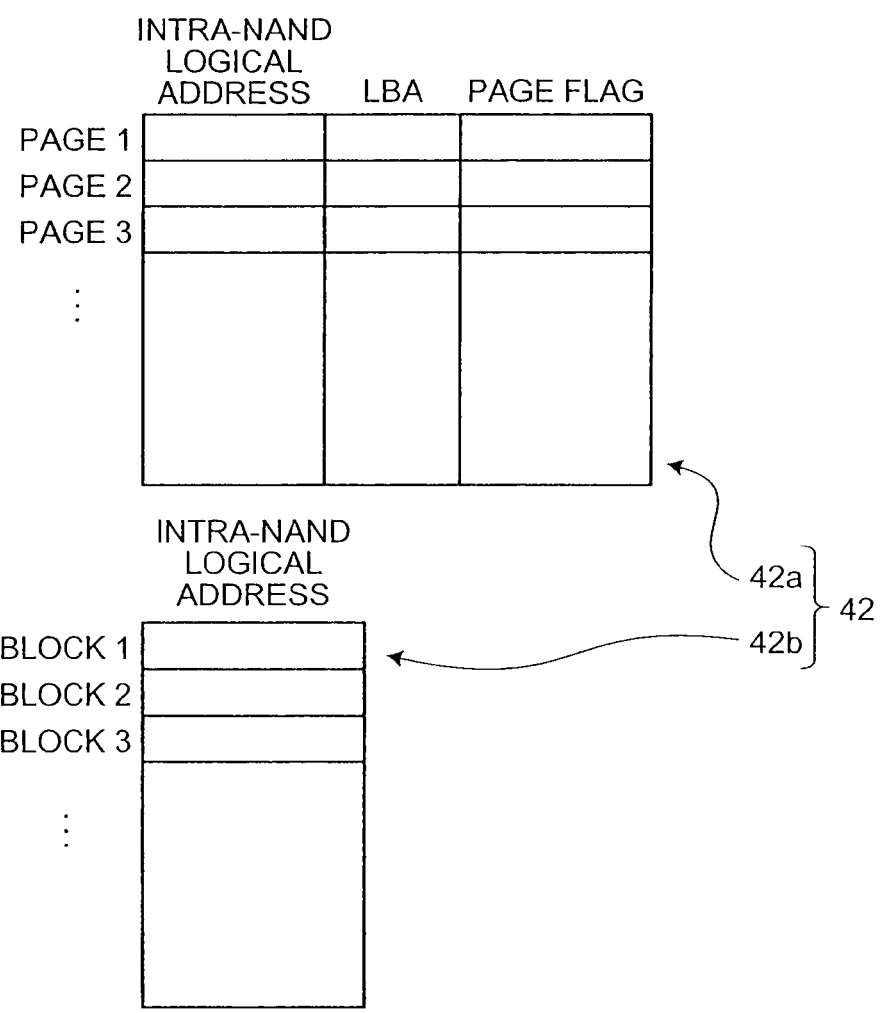
FIG. 6 illustrates an example of a logical NAND management information table.
Figure 7:
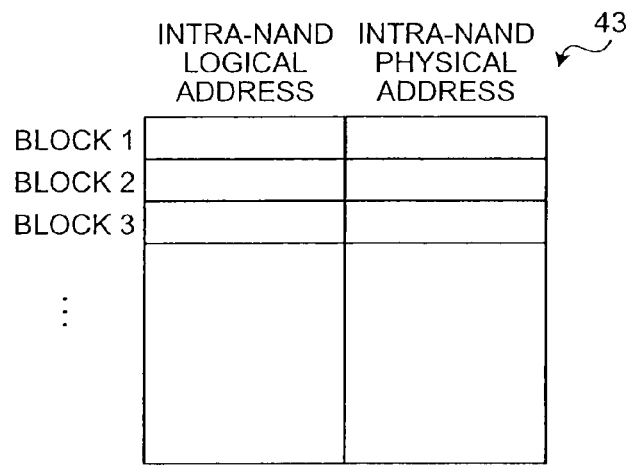
FIG. 7 illustrates an example of an intra-NAND logical-physical conversion information table.

FIG. 6 illustrates an example of the logical NAND management information 42 in tabular manner. FIG. 7 illustrates an example of intra-NAND logical-physical conversion information 43 in tabular manner. As shown in FIG. 6, the logical NAND management information 42 includes logical page management information 42a and logical block management information 42b. The logical page management information 42a has one entry for one logical area of a one page size. Each of entries includes an LBA of data of the one page size, an intra-NAND logical address, and a page flag indicating whether this page is valid. The logical block management information 42b includes an intra-NAND logical address set for a logical area of the one block size of the NAND memory 12.

The logical page management information 42a and the logical block management information 42b are created for each of the data storage area 125 and the save area 127 and stored. As shown in FIG. 7, in the intra-NAND logical-physical conversion information 43, the intra-NAND physical address and the inter-NAND logical address of the NAND memory 12 are associated.

By using these kinds of management information, a correspondence of the LBA used in the host apparatus, the intra-NAND logical address used in the NAND memory 12, and the intra-NAND physical address used in the NAND memory 12 can be established. This makes it is possible to exchange data between the host apparatus and the memory system 10.

The management information managed by the DRAM management layer 31 is lost because of power-off or the like so that this management information can be called a volatile table. On the contrary, if the management information managed by the logical NAND management layer 32 and the physical NAND management layer 33 is lost because of power-off or the like, the lost management information hinders successful startup of the memory system 10 so that measures are required to be taken such that the management information is stored even in the event of power-off or the like. Therefore, this management information can be called a nonvolatile table.

This nonvolatile table manages data stored in the NAND memory 12. If the nonvolatile table is not present, information stored in the NAND memory 12 cannot be accessed or data stored in an area is erased. Therefore, the nonvolatile table needs to be stored as latest information in preparation for sudden power-off. Therefore, in the first embodiment, management information including at least the nonvolatile table is stored in the latest state in the management information storage area 126 of the NAND memory 12. The management information storage information stored in the management information storage area 126 of the NAND memory 12 is explained below. The following explanation assumes that only the nonvolatile table is stored in the management information storage area 126.

Figure 8:
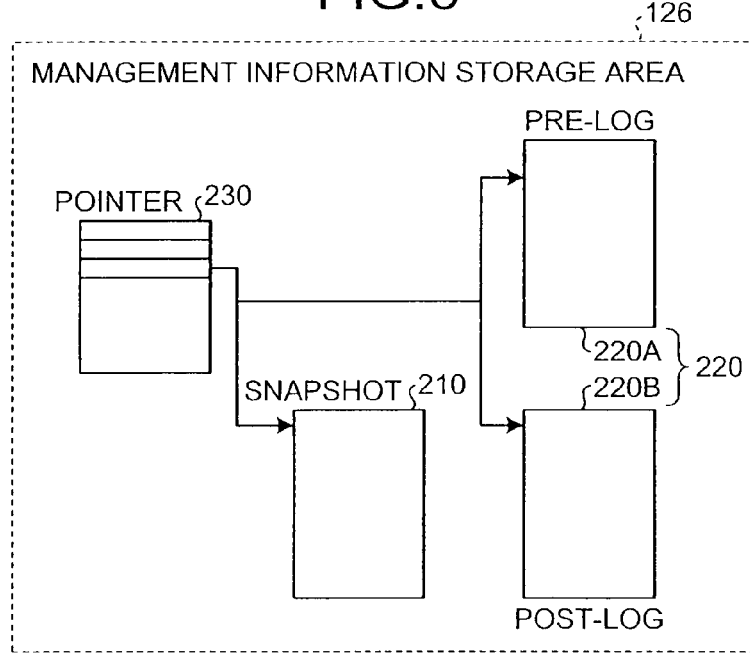
FIG. 8 is a schematic diagram of an example of contents of management information storage information stored in a management information storage area according to the first embodiment.

FIG. 8 is a schematic diagram of an example of contents of the management information storage information stored in the management information storage area 126. The management information storage information stored in the management information storage information 126 includes a snapshot 210 as contents of the nonvolatile table at a certain point, a log 220 as difference information between the nonvolatile table after the contents are changed when there is a change in the contents of the nonvolatile table and the snapshot 210 (or the snapshot 210 and a log already generated), and a pointer 230 indicating positions of the snapshot 210 and the log 220 acquired first concerning the snapshot 210 are stored. The snapshot 210 is information obtained by storing management information including at least the nonvolatile table at a predetermined point among the management information stored in the temporary storage area 111 of the DRAM 11. The log 220 is generated before and after processing in which the management information changes (e.g., processing for writing data in the data storage area 125 of the NAND memory 12). A log stored before the processing is referred to as a pre-log 220A and a log stored after the processing is referred to as post-log 220B.

The snapshot 210, the pre-log 220A, the post-log 220B, and the pointer 230 are stored in different blocks. The snapshot 210 is stored in a block for snapshot storage. The snapshot 210 includes the logical NAND management information 42 and the intra-NAND logical-physical conversion information 43 as nonvolatile tables in the management information storage area 126 of the NAND memory 12. In general, when a storage capacity of the NAND memory 12 is equal to or larger than several tens GB, a size an integer times as large as the physical block is necessary as the size of management information necessary for data management. Therefore, this snapshot storing block is stored in a logical block including a plurality of physical blocks. The new snapshot 210 is collectively written in a block different from that for the snapshot 210 stored earlier.

Figure 9:
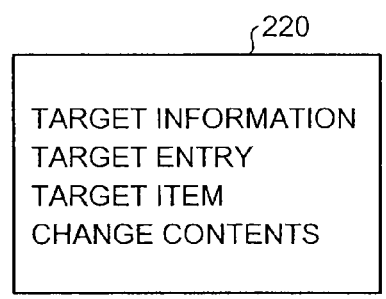
FIG. 9 depicts an example of a log.

The pre-log 220A and the post-log 220B are stored in a pre-log storing block and a post-log storing block, respectively, in a write-once manner. The pre-log 220A and the post-log 220B are continuously written in the same pre-log storing block and the same post-log storing block, respectively, in a write-once manner even if a generation of the snapshot 210 changes. Each of the pre-log storing block and the post-log storing block includes a plurality of physical blocks. FIG. 9 is a diagram of an example of the log.

The log 220 includes target information to be management information of a change target, a target entry as an entry to be a change target in the target information, a target item as an item to be a change target in the target entry, and change contents as contents of a change of the target item.

The pointer 230 is stored in an instruction information storage block. The pointer 230 only has to be a pointer that indicates a top address of a block indicating storage positions of the snapshot 210, the pre-log 220A, and the post-log 220B. However, a portion indicating a storage position of the snapshot 210 in the pointer 230 can be a portion that indicates top addresses of respective kinds of management information included in the snapshot 210. The pointer 230 is updated when the snapshot 210 is stored anew or when the physical block storing the log 220 in a log storing block is changed. Pointers of the pre-log 220A and the post-log 220B can be stored in the snapshot 210 rather than in the instruction information storing block.

Figure 10:
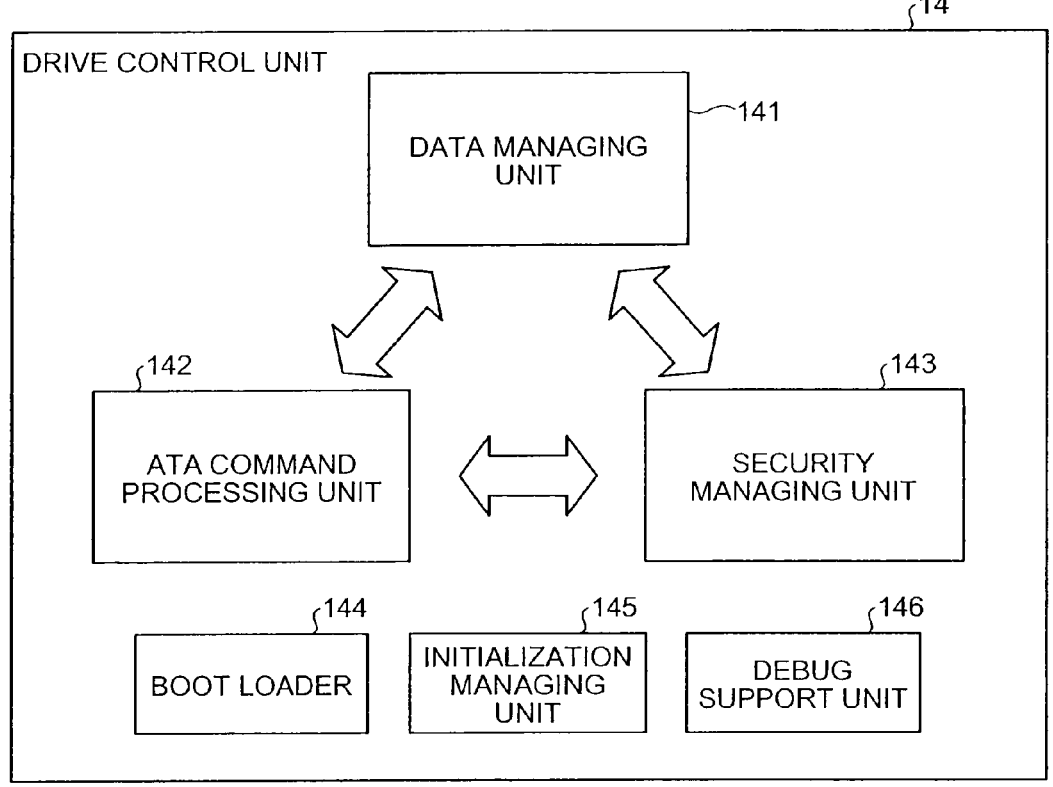
FIG. 10 is a block diagram of an example of a functional configuration of a drive control unit shown in FIG. 1.

Functions of the drive control unit 14 are explained below. FIG. 10 is a block diagram of an example of a functional configuration of the drive control unit. The drive control unit 14 includes a data managing unit 141, an ATA command processing unit 142, a security managing unit 143, a boot loader 144, an initialization managing unit 145, and a debug support unit 146. The data managing unit 141 performs data transfer between the DRAM 11 and the NAND memory 12 and control of various functions concerning the NAND memory 12. The ATA command processing unit 142 performs data transfer processing in cooperation with the data managing unit 141 based on an instruction received from the ATA interface. The security managing unit 143 manages various kinds of security information in cooperation with the data managing unit 141 and the ATA command processing unit 142. The boot loader 144 loads management programs (firmware) from the NAND memory 12 to a not shown memory (e.g., an SRAM (Static RAM)) during power-on. The initialization managing unit 145 performs initialization of respective controllers and circuits in the drive control unit 14. The debug support unit 146 processes debug data supplied from the outside via the RS232C interface.

Figure 11:
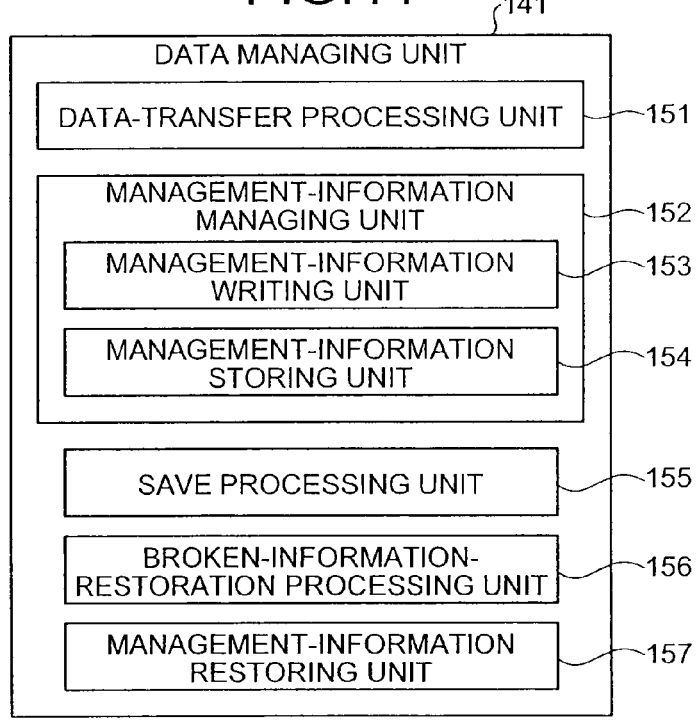
FIG. 11 is a block diagram of an example of a functional configuration of a data managing unit shown in FIG. 11.

FIG. 11 is a block diagram of an example of a functional configuration of the data managing unit 141. The data managing unit 141 includes a data-transfer processing unit 151, a management-information managing unit 152, a save processing unit 155, a broken-information-restoration processing unit 156, and a management-information restoring unit 157. The data-transfer processing unit 151 performs data transfer between the DRAM 11 and the NAND memory 12. The management-information managing unit 152 performs change and storage of the management information according to a change in data stored in the DRAM 11 and the NAND memory 12. The save processing unit 155 saves, in the save area 127, data likely to be broken by lower order page data breakage during write-once processing of data in the write-once area 128. The broken-information-restoration processing unit 156 restores information broken by lower order page data breakage during the write-once processing of data in the write-once area 128 using the data in the save area 127. The management-information restoring unit 157 restores latest management information based on the management information stored in the NAND memory 12 during power-on or the like.

The management-information managing unit 152 includes a management-information writing unit 153 and a management-information storing unit 154. The management-information writing unit 153 performs update of the management information stored in the DRAM 11 when update of the management information is necessary according to the change processing for data stored in the DRAM 11 or the NAND memory 12 by the data-transfer processing unit 151.

When the memory system 10 satisfies a predetermined condition, the management-information storing unit 154 stores, in the management information storage area 126 of the NAND memory 12, the management information as the snapshot 210 or stores information to be updated in the management information as the log 220. When a position where the pointer 230 is written is changed according to the storage of the snapshot 210 or the log 220 (the pre-log 220A and the post-log 220B), the management-information storing unit 154 also performs update processing for the pointer 230.

Storing of the snapshot 210 is performed by the management-information storing unit 154 when a predetermined condition relating to the memory system 10 is satisfied. Storing of the snapshot 210 is performed, for example, when a log storage area provided to store the log 220 (the pre-log 220A and the post-log 220B) in the management information storage area 126 of the NAND memory 12 becomes full (i.e., the area is completely filled with data).

Storing of the log 220 (the pre-log 220A and the post-log 220B) is performed by the management-information storing unit 154 during data update (when data writing in the NAND memory 12 is necessary) on the NAND memory 12 involving update of the management information (the nonvolatile table) stored in the DRAM 11.

When write data is written in the write-once area 128 by the data-transfer processing unit 151 or the management-information storing unit 154, if a page in which the write data is written is a different page (a higher order page) of a memory cell transistor same as that for a written page in which data is already written, the save processing unit 155 performs processing for storing the written data stored in the written page in the save area 127 in preparation for occurrence of lower order page data breakage due to occurrence of a short break or a program error during writing of the write data.

Figure 12A:
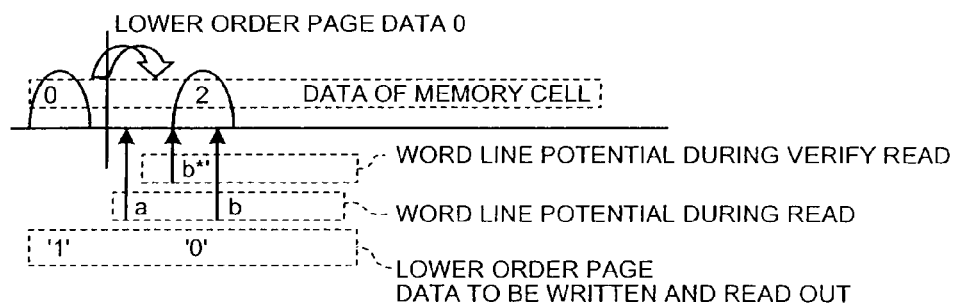
FIGS. 12A to 12D are diagrams of examples of a relation between data in a memory cell and a threshold voltage of the memory cell and order of writing in a NAND memory.
Figure 12B:
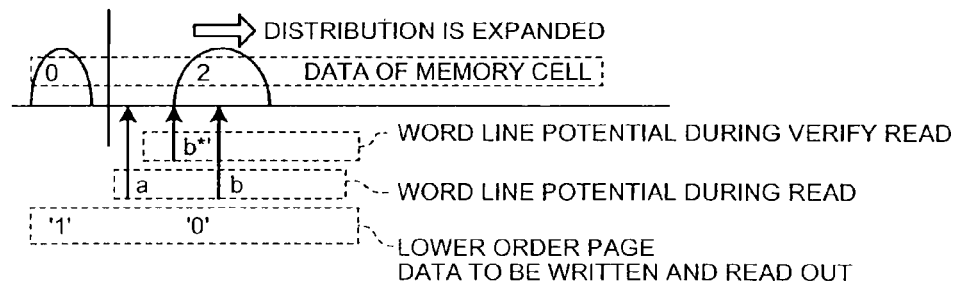
Figure 12C:
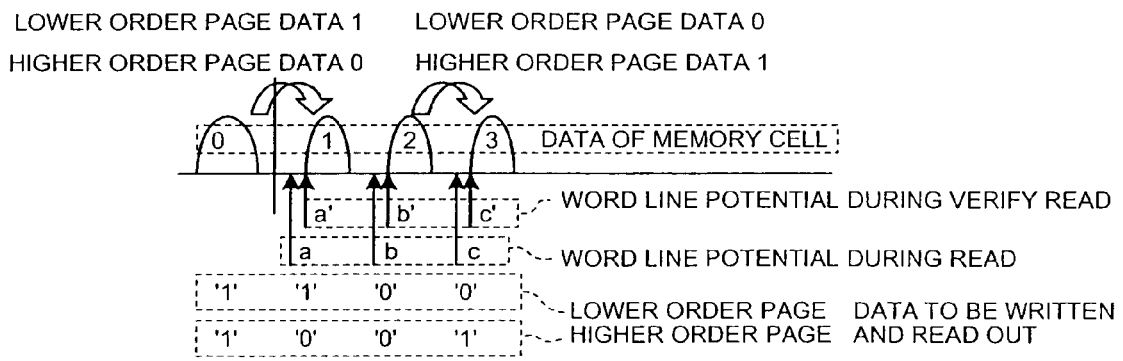

FIGS. 12A to 12D are diagrams of examples of a relation between data in a memory cell and a threshold voltage of the memory cell and order of writing in a NAND memory. FIGS. 13A to 13E are diagrams for explaining lower order page data breakage during write-once processing. First, the data in the memory cell is set to "0" when an erasing operation is performed. Subsequently, as shown in FIG. 12A, when writing in a lower order page is performed, the data in the memory cell changes to data "0" and data "2". As shown in FIG. 12B, before writing in a higher order page, data equal to or lower than a threshold voltage of actual data is written in an adjacent cell. Then, a distribution of a threshold of the data "2" is expanded by the data written in the cell. Thereafter, when data of the higher order page is written, the data in the memory cell changes to data "0" to "3" having an original threshold voltage as shown in FIG. 12C. In the present embodiment, the data in the memory cell is defined from low to high threshold voltages.

Figure 12D:
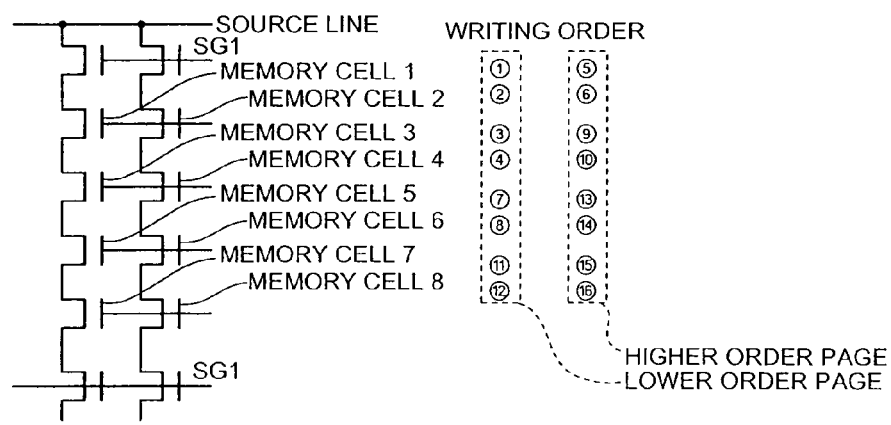

Writing processing in the NAND memory 12 is explained below. As shown in FIG. 12D, a writing operation is performed for each of pages from a memory cell close to a source line in a block. In FIG. 12D, for convenience of explanation, four word lines are shown.

In first writing (indicated by encircled 1), 1-bit data is written in a lower order page of a memory cell 1. In second writing (indicated by encircled 2), 1-bit data is written in a lower order page of a memory cell 2 adjacent to the memory cell 1 in a word line direction. In third writing (indicated by encircled 3), 1-bit data is written in a lower order page of a memory cell 3 adjacent to the memory cell 1 in a bit line direction. In fourth writing (indicated by encircled 4), 1-bit data is written in a lower order page of a memory cell 4 diagonally adjacent to the memory cell 1.

In fifth writing (indicated by encircled 5), 1-bit data is written in a higher order page of the memory cell 1. In sixth writing (indicated by encircled 6), 1-bit data is written in a higher order page of the memory cell 2 adjacent to the memory cell 1 in the word line direction. In seventh writing (indicated by encircled 7), 1-bit data is written in a lower order page of a memory cell 5 adjacent to the memory cell 3 in the bit line direction. In eighth writing (indicated by encircled 8), 1-bit data is written in a lower order page of a memory cell 6 diagonally adjacent to the memory cell 3.

In ninth writing (indicated by encircled 9), 1-bit data is written in a higher order page of the memory cell 3. In tenth writing (indicated by encircled 10), 1-bit data is written in a higher order page of the memory cell 4 adjacent to the memory cell 3 in the word line direction. In eleventh writing (indicated by encircled 11), 1-bit data is written in a lower order page of a memory cell 7 adjacent to the memory cell 5 in the bit line direction. In twelfth writing (indicated by encircled 12), 1-bit data is written in a lower order page of a memory cell 8 diagonally adjacent to the memory cell 5.

In thirteenth writing (indicated by encircled 13), 1-bit data is written in a higher order page of the memory cell 5. In fourteenth writing (indicated by encircled 14), 1-bit data is written in a higher order page of the memory cell 6 adjacent to the memory cell 5 in the word line direction. In fifteenth writing (indicated by encircled 15), 1-bit data is written in a higher order page of the memory cell 7. In sixteenth writing (indicated by encircled 16), 1-bit data is written in a higher order page of the memory cell 8 adjacent to the memory cell 7 in the word line direction.

The save processing unit 155 stores, as page position information, a relation between the lower order pages and the higher order pages explained above, i.e., a relation between the lower order pages and the higher order pages that are likely to cause lower order page data breakage.

Figure 13D:
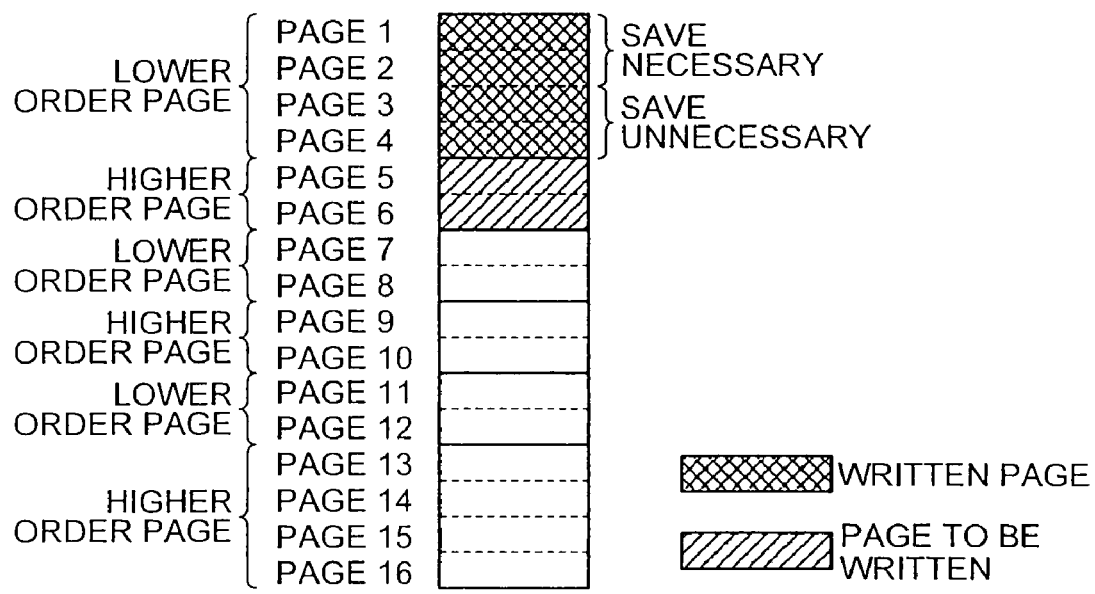

Pages in one physical block in FIG. 13A correspond to FIGS. 12A to 12D. In other words, pages 1 to 4, 7 to 8, and 11 to 12 are the lower order pages shown in FIGS. 12A to 12D. Pages 5 to 6, 9 to 10, and 13 to 16 are the higher order pages shown in FIGS. 12A to 12D. The write-once processing for writing in a block having such a page structure performed when save processing is necessary and the write-once processing performed when the save processing is unnecessary are separately explained below. In FIGS. 13A to 13E, pages are separated into lower order pages and higher order pages for convenience of explanation. However, a combination of the lower order pages and the higher order pages forms one physical block.

(1) The Write-Once Processing Performed when Save Processing is Necessary (1-1) Data is Written Only in the Lower Order Pages As shown in FIG. 13B, the save processing is unnecessary when data is written only in the lower order pages (e.g., pages 1 to 4) in a write-once manner. This is because, in this case, lower order page data breakage does not occur even if a short break occurs while the data is written in the lower order pages.

(1-2) Data is Written in the Lower Order Pages and the Higher Order Pages not Including Written Pages As shown in FIG. 13C, the save processing is necessary when data is written in the lower order pages and the higher order pages not including written pages. This is because, in this case, the data is written in the lower order pages 1 to 4 and the higher order pages 5 to 6 and lower order page data breakage does not occur because the lower order pages 1 and 2 corresponding to the higher order pages 5 and 6 are not written pages.

(2) The Save Processing is Necessary (2-1) Data is Written Only in the Higher Order Pages As shown in FIG. 13D, when data is written only in the higher order pages in a write-once manner, the lower order pages are always written pages. In this case, lower order pages in which lower page data breakage is likely to be caused by higher order pages in which write data is written are calculated from page position information. Contents stored in the lower order pages are saved in the save area 127. This is because, in this processing, when a short break occurs during writing in higher order pages, it is likely that lower order pages corresponding thereto (i.e., lower order pages of a memory cell transistor same as that for the higher order pages in which data is written) are broken. In the case illustrated in FIG. 13D, when writing is performed in the higher order pages 5 and 6, the lower order pages 1 are 2 are saved in the save area 127 from the page position information shown in FIGS. 12A to 12D.

Figure 13E:
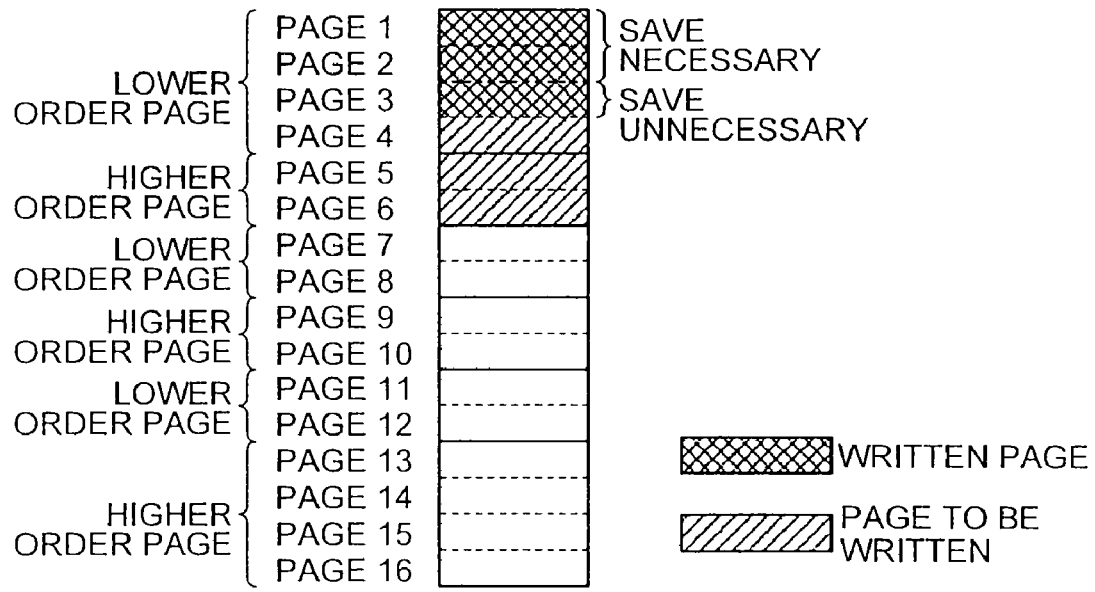

(2-2) Data is written in the lower order pages and the higher order pages including written pages As shown in FIG. 13E, when data is written in the lower order pages and the higher order pages including written pages, lower order pages in which lower page data breakage is likely to be caused by higher order pages in which data to be written in the higher order pages among the data is written are calculated from page position information. Contents stored in the lower order pages are saved in the save area 127. In the case illustrated in FIG. 13E, the data is written in a write-once manner in the lower order pages and the higher order pages, i.e., pages 4 to 6. In this case, the lower order pages 1 and 2 corresponding to pages 5 and 6 written in the higher order pages are calculated from the page position information shown in FIGS. 12A to 12D. Contents of the pages 1 and 2 are saved in the save area 127.

If a program error or a short break occurs and lower order page data breakage occurs during write-once processing for writing in the higher order pages of the write-once area 128, when the power supply of the memory system 10 is turned on after the program error or the short break, the broken-information-restoration processing unit 156 performs processing for restoring data in a position where the lower order page data breakage occurs using the data saved in the save area 127.

When the power supply of the memory system 10 is turned on, the management-information restoring unit 157 performs restoration processing for the management information based on the management information storage information stored in the management information storage area 126 of the NAND memory 12. Specifically, the management-information restoring unit 157 traces the pointer 230 and the log 220 (the pre-log 220A or the post-log 220B) in order and determines whether the log 220 (the pre-log 220A or the post-log 220B) corresponding to the latest snapshot 210 is present. When the log 220 is not present, the management-information restoring unit 157 restores the snapshot 210 in the snapshot storing block in the DRAM 11 as management information. When the log 220 is present, because abnormal end such as a program error or a short break has occurred, the management-information restoring unit 157 acquires the snapshot 210 from the snapshot storing block, acquires the log 220 (the pre-log 220A or the post-log 220B) from the log storing block, and performs restoration of the management information (the nonvolatile table) reflecting the log 220 on the snapshot 210 on the DRAM 11.

Processing for writing data in the write-once area 128 is explained. FIG. 14 is a flowchart of an example of a procedure of processing for writing data in the write-once area of the memory system. It is assumed that the memory system 10 is connected to the host apparatus and operates as the secondary storage device of the host apparatus and the host apparatus (the memory system 10) is in a startup state.

When the memory system 10 is in the started state, the save processing unit 155 receives an instruction for write-once processing for data (Step S11). The save processing unit 155 acquires a writing position for the data to be subjected to the write-once processing (hereinafter referred to as write data) (Step S12). Subsequently, the save processing unit 155 determines whether a part of the acquired writing position includes a higher order page and determines whether a lower order page corresponding to the higher order page is a written page (Step S13).

When a part of the writing position includes a higher order page and a lower order page corresponding to the higher order page is a written page ("Yes" at Step S13), the save processing unit 155 acquires, using the page position information, a lower order page that uses a memory cell same as that for the higher order page in the writing position (Step S14). Subsequently, the management-information managing unit 152 determines an update schedule (including processing for storage in the save area 127) for the management information by execution of the write-once processing (Step S15) and stores the update schedule in the management information storage area 126 of the NAND memory 12 as the pre-log 220A (Step S16). Thereafter, the save processing unit 155 stores contents of data stored in the lower order page acquired at Step S14 in the save area 127 (Step S17). After writing the write data in the writing position in a write-once manner (Step S18), the data-transfer processing unit 151 saves the post-log 220B in the management information storage area 126 of the NAND memory 12 (Step S19) and the write-once processing for the data ends.

On the other hand, when a part of the writing position does not include a higher order page or when a lower order page corresponding to the higher order page is not a written pate ("No" at Step S13), the management-information managing unit 152 determines an update schedule for the management information by execution of the write-once processing (Step S20) and stores the update schedule in the management information storage area 126 of the NAND memory 12 as the pre-log 220A (Step S21). Thereafter, after writing the write data in the writing position in a write-once manner (Step S22), the data-transfer processing unit 151 saves the post-log 220B in the management information storage area 126 of the NAND memory 12 (Step S23) and the write-once processing for the data ends.

Figure 15:
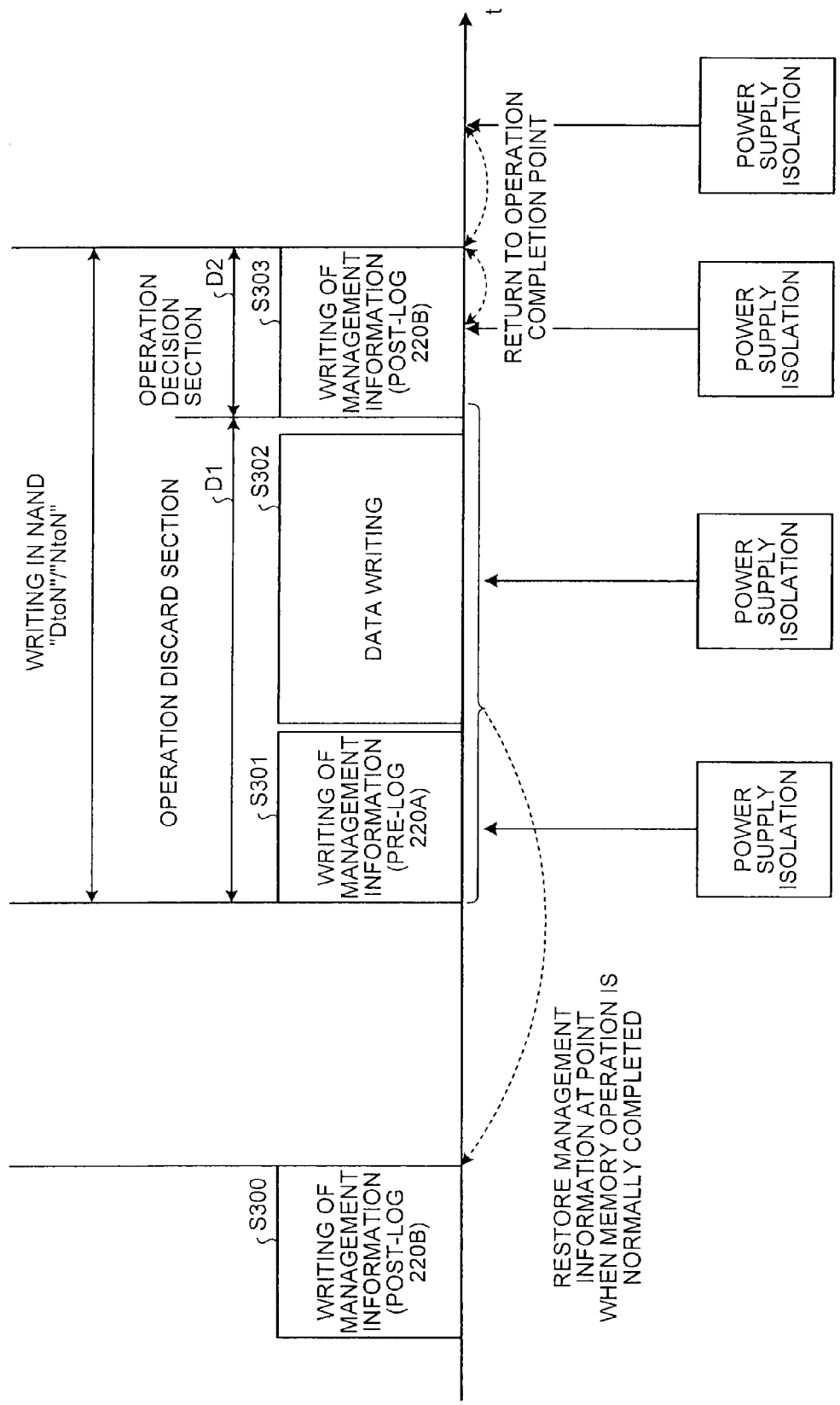
FIG. 15 is a diagram of an example of a rule for aligning data in the NAND memory and management information in the write-once processing.
Figure 17:
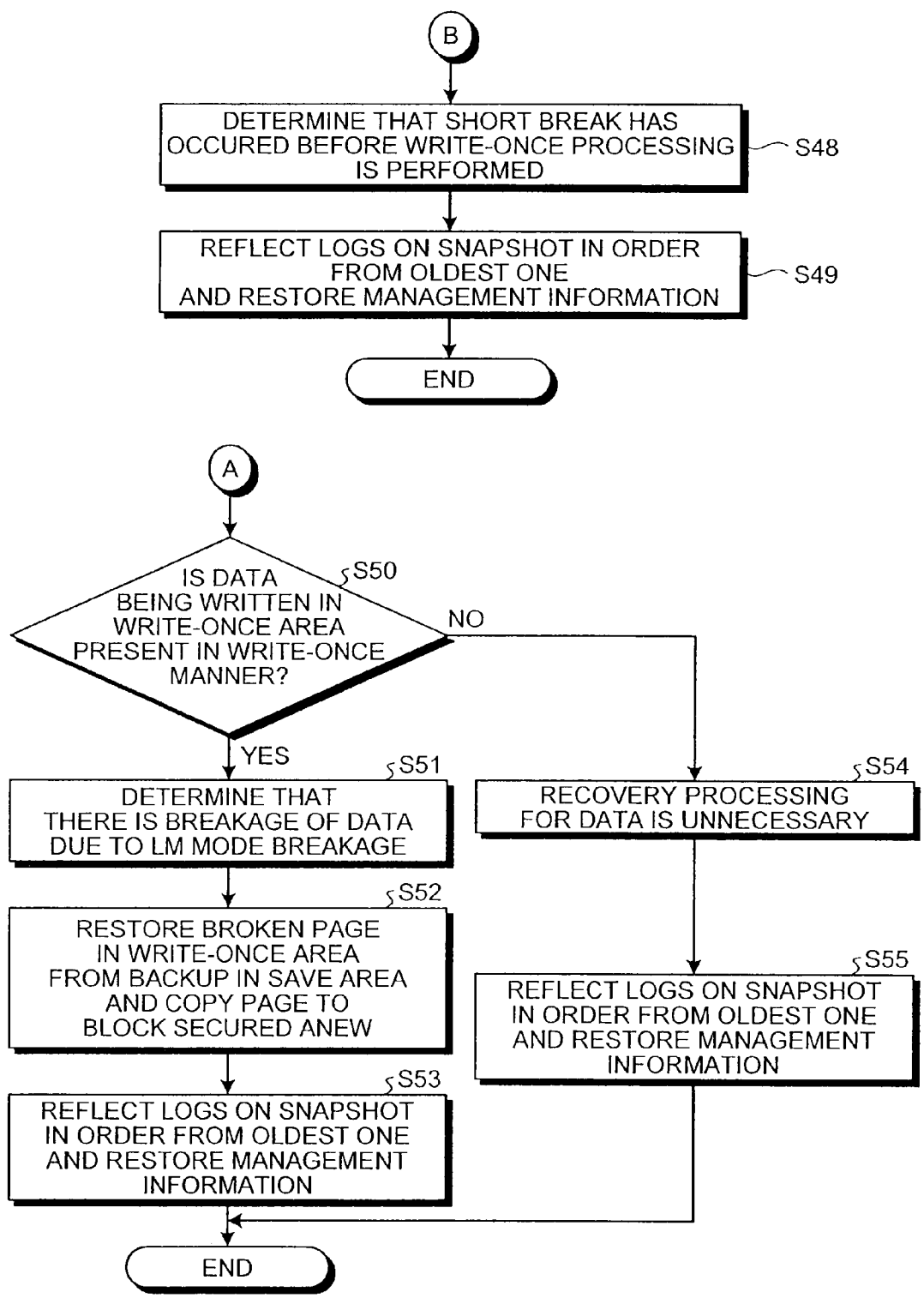

During the execution of the processing illustrated in the flowchart in FIG. 14, an abnormal power supply isolation (a short break) can occur any time. Therefore, the data written in the NAND memory 12 and the management information always need to be consistent. Therefore, a rule for protecting the data is set in preparation for occurrence of a short break during the execution of the processing illustrated in the flowchart in FIG. 14. FIG. 15 is a diagram for explaining an example of a rule for matching the data in the NAND memory and the management information in the write-once processing. The abscissa indicates elapsed time t. In FIG. 15, after write processing for the post-log 220B with respect to any one of the kinds of processing explained above ends (Step S300), write processing (storage) for the pre-log 220A (Step S301), write-once processing for write data (Step S302), and write processing (storage) for the post-log 220B (Step S303) are performed for the next write-once processing.

When a short break occurs from the write processing for the pre-log 220A (Step S301) to the write-once processing for the write data (Step S302), the processing for writing the write data in the NAND memory 12 has not ended properly due to the short break. In this case, if operations until the occurrence of the short break is not discarded and the contents written in the pre-log 220A are adopted as management information, information not actually written in the NAND memory 12 is written. In other words, mismatch occurs between the data written in the NAND memory 12 and the management information. Therefore, in this case, the operation performed until a time point at which the short break occurred is discarded. A time span in which the operation is discarded is referred to as an operation discard section D1.

On the other hand, when the write-once processing for the write data (Step S302) ends and a short break occurs at a stage after the write processing for the post-log 220B (Step S303), the processing for writing the write data in the NAND memory 12 has ended properly. In this case, even if the operation until the occurrence of the short break is not discarded and the contents written in the pre-log 220A are adopted as management information, no problem occurs because the write data has been already written in the NAND memory 12. Therefore, in this case, operation that was being executed during the time span in which the short break continued is decided. A time span in which the operation is decided is referred to as an operation decision section D2.

Restoration processing for the NAND memory 12 after a short break occurs during the write-once processing for data shown in FIGS. 13A to 13E is explained below. FIGS. 16 are 17 are flowcharts of an example of restoration processing for write data after occurrence of a short break. As in the above explanation, it is assumed that the memory system 10 is connected to the host apparatus and operates as the secondary storage device of the host apparatus.

First, the power supply of the host apparatus is turned on and a startup instruction is issued to the memory system 10 (Step S31). The boot loader 144 shown in FIG. 10 transfers a not-shown management program from the NAND memory 12 to a memory such as an SRAM or the DRAM 11 (Step S32) and starts the management program (Step S33). By starting the management program, processing by the respective functional processing units in the data managing unit 141 shown in FIG. 11 can be performed.

Subsequently, the management-information restoring unit 157 reads the latest pointer 230 in the management information storage area 126 of the NAND memory 12 and acquires addresses of blocks in which the snapshot 210 and the pre-log 220A and the post-log 220B are stored (Step S34).

The management-information restoring unit 157 reads the snapshot 210 from the address in the NAND memory 12 acquired at Step S34 and restores the snapshot 210 in the temporary storage area 111 of the DRAM 11 (Step S35).

The management-information restoring unit 157 checks a last writing position of a log referring to the pre-log 220A and the post-log 220B in the NAND memory 12 and compares writable page positions to detect a log written last and timing for power supply isolation (Step S36). Thereafter, the management-information restoring unit 157 determines whether a short break has occurred (Step S37). In determining whether a short break has occurred, the management-information restoring unit 157 compares the number of pages from a writing position to a last writing position of the first pre-log 220A generated for the reference snapshot 210 and the number of pages from a writing position to a last writing position of the first post-log 220B generated in the same manner. When the numbers of pages are different, the management-information restoring unit 157 determines that a short break has occurred. Otherwise, the management-information restoring unit 157 determines that a short break has not occurred. When the numbers of pages are different, the management-information restoring unit 157 compares contents of the logs written last. When the contents are the same, the management-information restoring unit 157 determines that a short break has not occurred. Otherwise, the management-information restoring unit 157 determines that a short break has occurred.

When a short break has not occurred ("No" at Step S37), the management-information restoring unit 157 restores the management information from the snapshot 210 restored in the temporary storage area 111 of the DRAM 11 at Step S35 (Step S38) and the restoration processing ends.

On the other hand, when a short break has occurred ("Yes" at Step S37), the management-information restoring unit 157 determines whether a section where the short break has occurred is the operation discard section D1 (Step S39). When the section where the short break has occurred is not the operation discard section D1, i.e., when the section where the short break has occurred is the operation decision section D2 ("No" at Step S39), the management-information restoring unit 157 expands the pre-log 220A present in the storage position acquired at Step S34 in the work area 112 of the DRAM 11 (Step S40). The management-information restoring unit 157 reflects logs on the snapshot 210 in order from the oldest pre-log 220A and restores the management information (Step S41) and the restoration processing ends.

When the section where the short break has occurred is the operation discard section D1 in Step S39 ("Yes" at Step S39), the management-information restoring unit 157 expands the post-log 220B present in the storage position acquired at Step S34 in the work area 112 of the DRAM 11 (Step S42) and determines whether there is data being written in the save area 127 in a write-once manner (Step S43). When there is no data being written in the save area 127 in a write-once manner ("No" at Step S43), the management-information restoring unit 157 determines whether there is data being written in the write-once area 128 in a write-once manner (Step S44). When there is data being written in the write-once area 128 in a write-once manner ("Yes" at Step S44), it means that the power supply isolation is power supply isolation during the write-once processing for writing in a lower order page; therefore, the management-information restoring unit 157 determines that there is no breakage of data in the past by lower order page data breakage (Step S45). The management-information restoring unit 157 invalidates a relevant page or copies a valid page of a relevant block to a block secured anew (Step S46). Thereafter, the management-information restoring unit 157 reflects logs on the snapshot 210 in order from the oldest post-log 220B expanded in the DRAM 11 at Step S42 to the post-log 220B at a stage before the discard processing and restores the management information (Step S47) and the restoration processing ends.

When there is no data being written in the write-once area 128 in a write-once manner at Step S44 ("No" at Step S44), the management-information restoring unit 157 determines that the short break has occurred at a time point before the write-once processing is performed (Step S48). Therefore, recovery processing for the data in the write-once area 128 is unnecessary. The management-information restoring unit 157 reflects logs on the snapshot 210 in order from the oldest post-log 220B expanded in the DRAM 11 at Step S42 and restores the management information (Step S49) and the restoration processing ends.

When there is data being written in the save area 127 in a write-once manner at Step S43 ("Yes" at Step S43), the management-information restoring unit 157 further checks whether there is data being written in the write-once area 128 in a write-once manner (Step S50). When there is data being written in the write-once area 128 in a write-once manner ("Yes" at Step S50), it means that the power supply isolation is power supply isolation during the write-once processing for writing in a higher order page; therefore, the management-information restoring unit 157 determines that breakage of data in the past due to lower order page data breakage is likely to occur (Step S51). Because the write processing in the write-once area 128 has started, processing for backup in the save area 127 is guaranteed to be completed. Therefore, the management-information restoring unit 157 restores a broken page in the write-once area 128 from the backup in the save area 127 and copies the page to a block secured anew (Step S52). At the same time, the management-information restoring unit 157 reflects logs on the snapshot 210 in order from the oldest post-log 220B expanded in the DRAM 11 at Step S42 and restores the management information (Step S53) and the restoration processing ends.

Further, when there is no data being written in the write-once area 128 in a write-once manner at Step S50 ("No" at Step S50), the short break is a short break at a stage before write-once in the write-once area 128 is started. Therefore, the recovery processing for the data is unnecessary (Step S54). The management-information restoring unit 157 reflects logs on the snapshot 210 in order from the oldest post-log 220B expanded in the DRAM 11 at Step S42 and restores the management information (Step S55) and the restoration processing ends. In this case, the management-information restoring unit 157 performs processing for disabling writing of contents of a page being written in the save area 127 in a write-once manner. According to the procedure explained above, the restoration processing at the time of occurrence of a short break with respect to the write-once data ends.

As explained above, according to this embodiment, during the write-once processing for writing in a higher order page in the NAND memory 12 including the multi-value memory cells equal to or larger than 2 bits, the processing for writing in the higher order page is performed after contents of data stored in a lower order page of a multi-value memory cell same as that of the higher order page to be subjected to the write-once processing are stored in the save area 127. Therefore, there is an effect that, even when lower order page data breakage occurs because of occurrence of a short break or occurrence of a program error during the write processing, it is possible to restore data broken by the lower order page data breakage using the data stored in the save area 127.

In the example explained above, the memory cell transistor MT forming the NAND memory 12 is the multi-value memory equal to or larger than 2 bits. However, the present invention can be applied to any memory cell transistor MT as long as the memory cell transistor MT is the multi-value memory equal to or larger than 2 bits. In that case, pages include three or more pages such as a higher order page, an intermediate page, and a lower order page. During writing in the higher order page, it is likely that lower order page data breakage occurs in the intermediate page and the lower order page. In that case, data in the intermediate page and the lower order page are stored in the save area 127.

Further, in the above explanation, the save area 127 is provided in the NAND memory 12. However, a dedicated storing unit for the save area 127 may be provided in a nonvolatile memory of a type different from the NAND memory 12. The charge accumulating layer is not limited to the floating gate type and can be a charge trap type including a silicon nitride film such as the MONOS (Metal-Oxide-Nitride-Oxide-Semiconductor) structure and other systems.

As explained above, according to the present invention, there is an effect that, in the memory system having the NAND flash memory including the multi-value memory, even when a short break or a program error occurs during writing in a higher order page of a certain memory cell transistor, it is possible to restore contents of a lower order page of the memory cell transistor in which data is already written.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A memory system comprising:
a volatile first storing unit;
a nonvolatile second storing unit in which a plurality of memory cells that can store multi-value data are arranged, the memory cells having a plurality of pages; and
a controller that performs data transfer between a host apparatus and the second storing unit via the first storing unit, stores management information including a storage position of the data stored in the second storing unit during a startup operation of the memory system into the first storing unit, and performs, while updating the stored management information, data management in the first and second storing units based on the stored management information, the controller includes
a save processing unit that backs up, before writing data in the second storing unit, if data has been already written in a lower order page of a memory cell same as that of a page in which the data is written, the data of the lower order page; and
a broken-information-restoration processing unit that restores, when the data in the lower order page is broken, the broken data using the data backed-up by the save processing unit.

2. The memory system according to claim 1, wherein the save processing unit determines whether data has been already written in the lower order page of the memory cell same as that of a page in which the data is written based on page position information indicating a relation among different pages set for the same memory cell.

3. The memory system according to claim 1, wherein the save processing unit backs up, among the data that has been already written, data that is likely to be broken in a save area of the second storing unit.

4. The memory system according to claim 3, further comprising:
a management-information storing unit that stores, when the memory system satisfies a predetermined condition, the management information stored in the first storing unit in the second storing unit as management information storage information; and
a management-information restoring unit that restores, during the startup operation of the memory system, latest management information among the management information storage information stored in the second storing unit in the first storing unit.

5. The memory system according to claim 4, wherein the management information storage information includes
a snapshot as contents of the management information at a certain point,
logs as difference information between the management information after the contents are changed when there is a change in the contents of the management information because of the writing of the data and the snapshot or difference information between the management information after the change and the snapshot and an already-generated log, and
a pointer indicating storage positions in the second storing unit of the snapshot and the log acquired first concerning the snapshot, and
the management-information restoring unit restores, during the startup operation of the memory system, the management information in the first storing unit using a latest snapshot in the management information storage information, using the log if there is the log in the snapshot, or using the data if there is the data being written in the save area.

6. The memory system according to claim 5, wherein the logs include pre-logs stored before writing of the data and post-logs stored after the writing of the data, and
the management-information restoring unit uses any one of the pre-logs and the post-logs for restoration of the management information.

7. The memory system according to claim 6, wherein the management-information restoring unit restores, when a number of pages from a writing position of a first one of the pre-logs generated concerning a reference snapshot to a last writing position and a number of pages from a writing position of a first one of the post-logs to a final writing potion are the same, the management information in the first storing unit using a latest snapshot in the management information storage information.

8. The memory system according to claim 6, wherein the management-information restoring unit restores, when
a number of pages from a writing position of a first one of the pre-logs generated concerning a reference snapshot to a last writing position and a number of pages from a writing position of a first one of the post-logs to a final writing potion are different, and
a short break or a program break occurs during writing of the post-logs,
the management information in the first storing unit using a latest snapshot in the management information storage information and all the pre-logs stored for the snapshot.

9. The memory system according to claim 6, wherein the management-information restoring unit restores, when
a number of pages from a writing position of a first one of the pre-logs generated concerning a reference snapshot to a last writing position and a number of pages from a writing position of a first one of the post-logs to a final writing potion are different, and
a short break or a program break occurs during a time span from writing of the pre-logs to end of writing of the data, the management information in the first storing unit using a latest snapshot in the management information storage information and all the post-logs normally stored for the snapshot.

10. The memory system according to claim 9, wherein
the second storing unit has a write-once area in which data is written and a non-write-once area in which data is collectively written in units of one or a predetermined number of physical blocks, and
the broken-information-restoration processing unit performs recovery processing for data in the write-once area according to presence or absence of data being written in the write-once area and the non-write-once area.

11. The memory system according to claim 10, wherein the broken-information-restoration processing unit determines, when there is no data being written in the save area and there is data being written in the write-once area, that a short break or a program error has occurred during writing in a lower order page, and performs processing for invalidating a page in which the data being written is present or copying a valid page of a block in which the data being written is present to another block.

12. The memory system according to claim 10, wherein the broken-information-restoration processing unit does not perform the recovery processing for the data when there is no data being written in the save area and there is no data being written in the write-once area either.

13. The memory system according to claim 10, wherein the broken-information-restoration processing unit performs, when there is data being written in the save area and there is data being written in the write-once area as well, processing for restoring a broken page in the write-once area using data backed up in the save area and copying the page to another block.

14. The memory system according to claim 10, wherein the broken-information-restoration processing unit does not perform the recovery processing for the data when there is data being written in the save area and there is no data being written in the write-once area either.

15. The memory system according to claim 1, wherein
the first storing unit is a DRAM, and
the second storing unit is a NAND flash memory.

* * * * *